US012135353B2

(12) United States Patent
Strickling et al.

(10) Patent No.: US 12,135,353 B2
(45) Date of Patent: Nov. 5, 2024

(54) INDIRECT ACQUISITION OF A SIGNAL FROM A DEVICE UNDER TEST

(71) Applicant: Tektronix, Inc., Beaverton, OR (US)

(72) Inventors: Sam J. Strickling, Portland, OR (US); David Everett Burgess, Beaverton, OR (US)

(73) Assignee: Tektronix, Inc.

( * ) Notice: Subject to any disclaimer, the term of this patent is extended or adjusted under 35 U.S.C. 154(b) by 0 days.

(21) Appl. No.: 17/098,155

(22) Filed: Nov. 13, 2020

(65) Prior Publication Data

US 2021/0148975 A1 May 20, 2021

Related U.S. Application Data

(60) Provisional application No. 63/050,053, filed on Jul. 9, 2020, provisional application No. 62/936,305, filed on Nov. 15, 2019.

(51) Int. Cl.
*G01R 31/3177* (2006.01)
*G01R 31/28* (2006.01)
(Continued)

(52) U.S. Cl.
CPC ..... *G01R 31/3177* (2013.01); *G01R 31/2886* (2013.01); *G05B 19/042* (2013.01);
(Continued)

(58) Field of Classification Search
CPC ... G01R 31/3177; G06F 30/32; G06F 3/0484; G05B 19/042; G05B 2219/50391
See application file for complete search history.

(56) References Cited

U.S. PATENT DOCUMENTS 9,774,765 B2 * 9/2017 Bryll ........................ G06T 7/90
11,221,349 B2 1/2022 Arlinsky et al.
(Continued)

FOREIGN PATENT DOCUMENTS

JP H0850163 2/1996
KR 1020090030429 3/2009
(Continued)

OTHER PUBLICATIONS

Visual Inspection with Computer Vision—YouTube Apr. 10, 2019 <https://www.youtube.com/watch?v=ZYg4QL5cfuk> (Year: 2019).*
(Continued)

*Primary Examiner* — Beau D Spratt
(74) *Attorney, Agent, or Firm* — Miller Nash LLP; Andrew J. Harrington

(57) ABSTRACT

A system for acquiring a test-and-measurement signal from a device under test (DUT) including a test-and-measurement probe, a user interface, a robot, and a controller. The probe is configured to acquire an electronic signal from the DUT. The user interface displays a digital representation of a physical electronic circuit of the DUT, including portrayals of virtual nodes that correspond to actual nodes on the DUT. The robot is configured to automatically position the probe with respect to the DUT. The controller is configured to receive from the user interface an electronic indication of a selected node of the digital representation of the physical electronic circuit, where the selected node is one of the virtual nodes. The controller is further configured to provide instructions to the robot to automatically position the probe to a position on the physical electronic circuit corresponding to the actual node.

18 Claims, 3 Drawing Sheets

(51) Int. Cl.
  *G05B 19/042*   (2006.01)
  *G06F 30/32*   (2020.01)
  *G06F 3/0484*   (2022.01)

(52) U.S. Cl.
  CPC .... *G06F 30/32* (2020.01); *G05B 2219/50391* (2013.01); *G06F 3/0484* (2013.01)

(56) References Cited

U.S. PATENT DOCUMENTS

| | | | |
|---|---|---|---|
| 2005/0140379 | A1 | 6/2005 | Furukawa et al. |
| 2006/0267622 | A1* | 11/2006 | Lagowski ............ G01R 31/312 324/754.21 |
| 2007/0013362 | A1* | 1/2007 | Loh ................... G01R 31/2886 324/750.01 |
| 2008/0235970 | A1 | 10/2008 | Crampton |
| 2015/0106669 | A1* | 4/2015 | Gintis ............ G01R 31/318544 714/712 |
| 2016/0352992 | A1* | 12/2016 | Saika ................... F16M 11/121 |
| 2017/0252002 | A1* | 9/2017 | Mine ................. A61B 8/4218 |
| 2018/0276331 | A1* | 9/2018 | Hotra ................. H04B 17/3912 |
| 2020/0064372 | A1* | 2/2020 | Arlinsky ............ G01R 1/06705 |
| 2021/0114223 | A1* | 4/2021 | Wee ........................ H04N 23/54 |
| 2021/0405269 | A1* | 12/2021 | Dong ................... G02B 5/1852 |

FOREIGN PATENT DOCUMENTS

| | | |
|---|---|---|
| KR | 1020170110523 | 10/2017 |
| WO | 2010076136 | 7/2010 |

OTHER PUBLICATIONS

Korean Intellectual Property Office, International Search Report and Written Opinion for International Patent Application PCT/US2020/060803, Mar. 11, 2021, 11 pages, Daejeon, Republic of Korea.

* cited by examiner

INDIRECT ACQUISITION OF A SIGNAL FROM A DEVICE UNDER TEST

CROSS-REFERENCES TO RELATED APPLICATIONS

This patent application claims the benefit of provisional Application No. 62/936,305, filed Nov. 15, 2019 and also claims the benefit of provisional Application No. 63/050,053, filed Jul. 9, 2020. Those applications are each incorporated into the present disclosure by this reference.

TECHNICAL FIELD

The subject matter relates to test and measurement systems, and more particularly to systems and methods for indirectly probing a device under test (DUT).

BACKGROUND

Test and measurement probes are typically used to establish an electrical, physical, or sometimes optical connection between a test point on a DUT, such as a pin of a particular integrated circuit (IC) on a printed circuit board (PCB), and an input of a test and measurement instrument, such as an oscilloscope, so that the test and measurement instrument may measure a signal of interest at that test point to validate that the DUT is operating as expected. However, manually probing a DUT can be challenging. First, a user must determine the correct type of probe to use for the test point and signal of interest. Second, the user must physically locate the correct test point on the DUT, which can be difficult and involve translating a point on a circuit schematic to a corresponding physical location on the DUT which may be unlabeled. Third, the user must physically position the probe to contact the test point either by holding the probe with the user's hand or by using a tripod or other accessory device to hold the probe, and must maintain the contact with the test point throughout the test, which can be extremely difficult given the small size of contemporary electrical components and high component density of contemporary PCBs. Additionally, the desired physical location can be buried, not visible, or unreachable by human dexterity with respect to board orientation. Moreover, a DUT may employ contemporary high-speed signal busses, such as Double Data Rate Gen 2 (DDR2), Double Data Rate Gen 4 (DDR4) and Peripheral Component Interconnect Express (PCIe) Gen 4, among others, which often use differential signaling, requiring that a probe used to measure these signals must be able to make simultaneous electrical contact with two test points. This may be even more challenging if the two test points are on different planes. Finally, the desired point may be unsafe to probe via human methods as it is in a dangerous voltage, current, temperature or other harmful environment.

Configurations of the disclosed technology address shortcomings in the prior art.

DETAILED DESCRIPTION

As described herein, aspects are directed to systems and methods for indirectly probing a Device Under Test (DUT). Example configurations allow the user-operator to select a node on the DUT by, for example, using a user interface to indicate a corresponding node on a digital representation of the DUT. In response to the selection by the user-operator, a test-and-measurement probe is automatically, selected based on DUT circuit geography and the type of signal expected at the selected node, and moved (by, for example, a robot) to a position on the DUT that corresponds to the node sought to be tested. Then, the test-and-measurement probe, generally in conjunction with a test-and-measurement instrument, acquires an electronic signal from the node. In some configurations, communication between the components of the system may occur via a network, such as a local area network, or the internet, for example.

Accordingly, aspects of the disclosed technology facilitate remote working because, for example, the user-operator can operate the robot from a remote location. In addition, multiple user-operators could be working on the same DUT remotely (both from the DUT and from each other), without needing to have the actual DUT with the user-operator. Hence, for example, the DUT itself could remain in a secure, confidential lab while the multiple user-operators are remotely working on the DUT. Also, example configurations allow the user-operator to avoid high voltages, high currents, a liquid cooling bath, hazardous environments, or other conditions that might be present at the DUT. Furthermore, design optimization of the DUT can occur sooner in the testing process because aspects of the disclosed technology allow in situ probing of DUTs located in hazardous environments. In addition, aspects of the disclosed technology may address the following problems: repeated probing of difficult areas where human ability and error leads to bad readings; automated testing for increased productivity, and setting up automated test procedures off design documents that can change and still maintain insight through redesigns.

As used in this disclosure, indirect acquisition or indirect probing mean that the user-operator does not directly probe the DUT by, for example, holding a probe and manually probing the desired nodes on the DUT. Instead, the operator works through a digital representation of the DUT, perhaps remotely from the DUT, and another device, such as a robot, performs the probing operation on the DUT.

Figure 1:
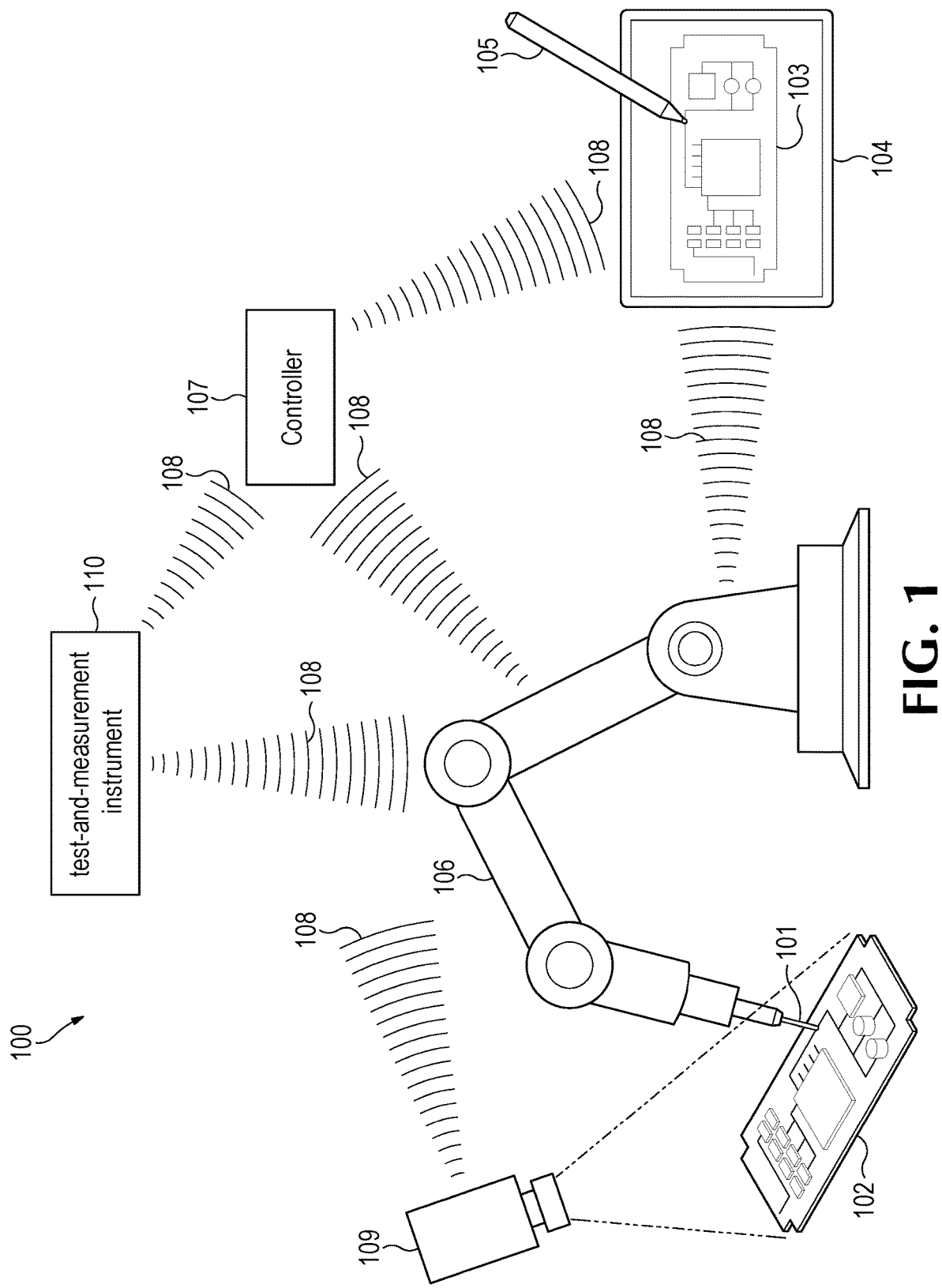
FIG. 1 is a graphical representation of a system allowing for indirect acquisition of a signal from a device under test, according to an example configuration.

FIG. 1 is a graphical representation of portions of a system allowing for indirect acquisition of a signal from a device under test 102, according to an example configuration. As illustrated in FIG. 1, the system 100 may include a test-and-measurement probe 101 configured to acquire a signal from a device under test 102 (DUT). The DUT 102 may include an electronic circuit, and the acquired signal may be an electrical signal, for example, one or more of a power, a voltage, or a current from the DUT 102. In another example, the DUT 102 may include an optical circuit, and the acquired signal maybe an optical signal. As another example, the system 100 may include a test-and-measurement probe 101 configured to acquire another type of analog signal from the DUT 102. The analog signal may represent, for example, one or more of a resistance, capacitance, insulative property, thermal mass, or heat from the DUT 102. The test-and-measurement probe 101 may be coupled to a test-and-measurement instrument 110, which may be used in conjunction with the test-and-measurement probe 101 to acquire the signal from the DUT. As noted above, the test-and-measurement instrument 110 may be, for example, an oscilloscope. In versions, the test-and-measurement probe 101 is configured to inject an electronic signal into the DUT 102 instead of, or in addition to, acquiring an electronic signal from the DUT. For example, the test-and-measurement probe 101 maybe a time-domain reflectometry (TDR) or time-domain transmissometry (TDT) probe, which includes signal generation circuitry to inject a fast step or pulse stimulus signal into a test point of the DUT, as well as circuitry to measure a signal from the DUT in response to the injected stimulus signal.

The system 100 may also include a digital representation 103 of the physical electronic circuit of the DUT 102. The digital representation 103 could be, as examples, a schematic diagram of the electronic circuit of the DUT 102 or a PCB design file for the electronic circuit. The PCB design file could be, for example, a Gerber file, a CAD (computer-aided design) file, or a CAM (computer-aided manufacturing) file, among other options. The digital representation 103 includes, for example, portrayals of virtual nodes that correspond to actual nodes on the DUT 102. As used in this disclosure, a node is a region of an electronic circuit that is between two circuit elements. Hence, a virtual node, as used here, is a digital representation of a physical node in an actual electronic circuit in the DUT 102. In embodiments where the digital representation 103 is a schematic diagram of the electronic circuit of the DUT, the system 100 may automatically correlate a virtual node in the schematic to the corresponding virtual node in the corresponding PCB design file, which in turn corresponds to a physical node in the actual electronic circuit in the DUT 102.

As illustrated in FIG. 1, the digital representation 103 may be displayed on, for example, a user interface 104, such as a screen or touchscreen of the user interface 104. The digital representation 103 may be a one-to-one scale representation of the physical electronic circuit of the DUT 102, or the digital representation 103 may be a different scale. For example, the digital representation 103 may be enlarged, relative to the physical electronic circuit of the DUT 102, to show detail and to allow the user-operator to more easily select a desired node.

The user interface 104 may be external to or integrated with a display. For example, the user interface 104 may include physical buttons located on a robot 106 (discussed below). In other examples, the user interface 104 may be a touch-sensitive feature of a display. The user interface 104 may be located on the robot 106, or it may be located on a remote device, such as a computer, smartphone, tablet, and the like. In versions, the user interface 104 may be part of or may include augmented reality hardware or virtual reality hardware. In versions, the user interface 104 may be part of the test-and-measurement instrument 110. As illustrated in FIG. 1, the user interface 104 is remote from the robot 106 to allow a user-operator to be remote from the DUT 102. The user interface 104 may include an input device 105, such as a mouse, a digital pen, stylus, one or more of the user's fingers, a gesture, or another selection device to allow the user-operator to electronically indicate a selected node of the digital representation 103 by using the input device 105 to choose one of the virtual nodes.

The system 100 may also include means to automatically position the test-and-measurement probe 101 with respect to the DUT 102. For example, as illustrated in FIG. 1, the system 100 may include a robot 106 configured to automatically position the test-and-measurement probe 101. The robot 106 could be, for example, a robotic arm, a two-axis positioning device, a three-axis positioning device, or other multi-degree-of-freedom machine. If the robot 106 is a robotic arm, the robotic arm could be, for example, a Selective Compliance Articulated Robot 106 Arm (SCARA). In another configuration, the test-and-measurement probe 101 may be in a fixed location, the DUT 102 may be mounted to or held by the robot 106, and the robot 106 may be configured to automatically position the DUT 102 with respect to the fixed test-and-measurement probe 101.

Figure 2:
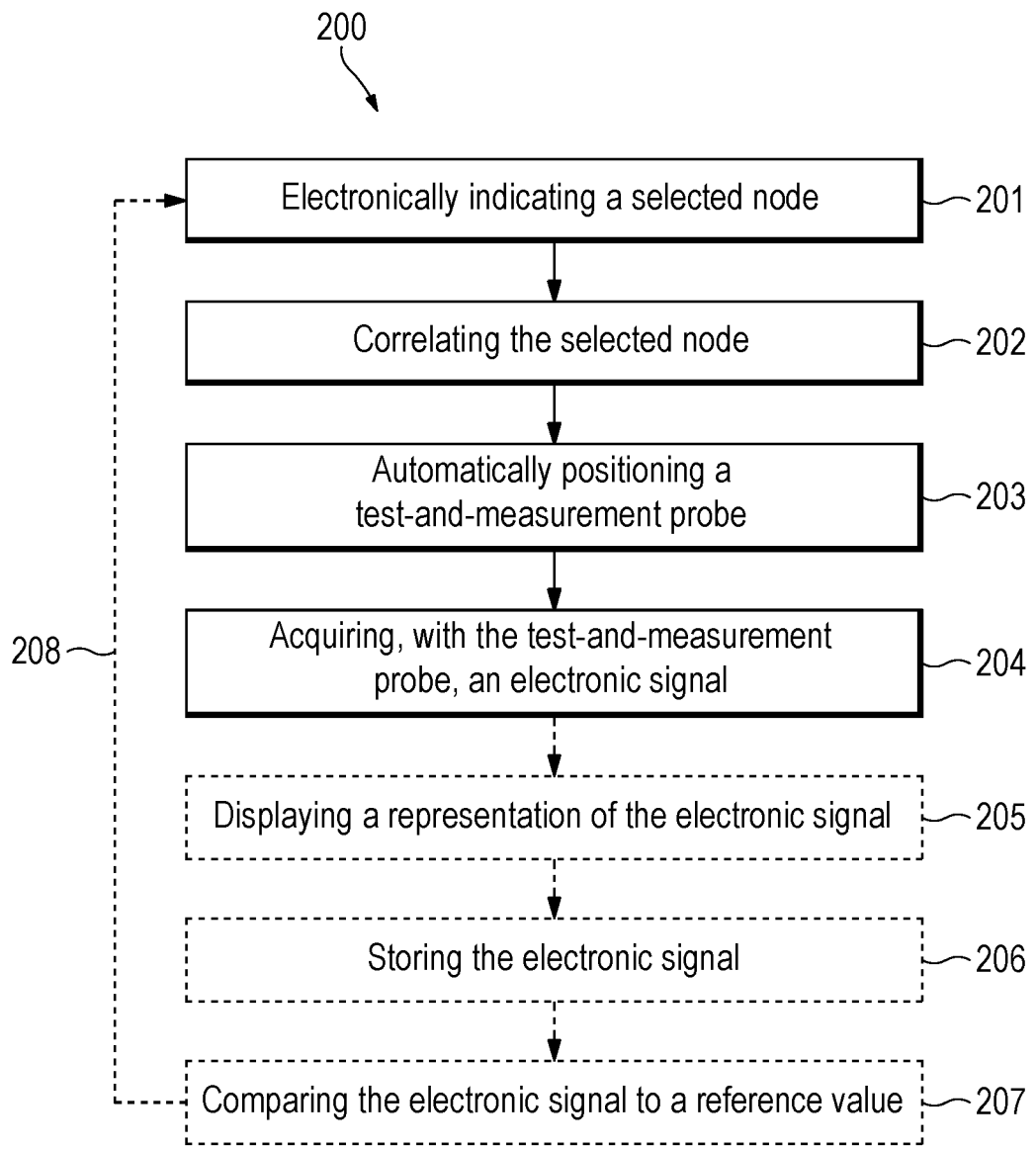
FIG. 2 illustrates an example method of indirectly acquiring a signal from a device under test, according to an example configuration.
Figure 3:
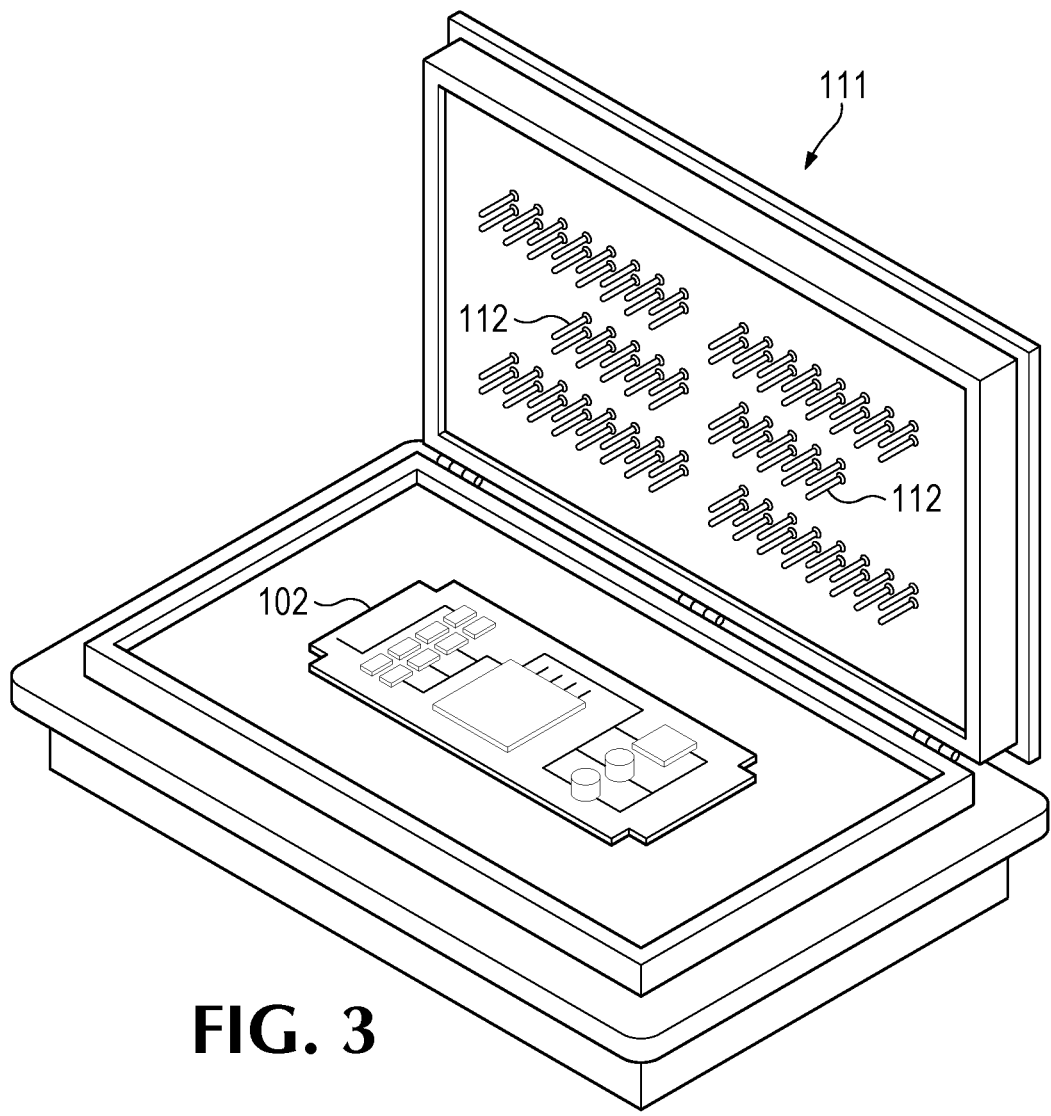
FIG. 3 illustrates portions of a system allowing for indirect acquisition of a signal from a device under test, according to an example configuration having a dynamically configurable testing apparatus comprising an array of pins.

FIG. 3 illustrates portions of a system allowing for indirect acquisition of a signal from a device under test, according to an example configuration having a dynamically configurable testing apparatus comprising an array of pins. As illustrated in FIG. 3, in versions, instead of the robot 106 depicted in FIG. 2, the means to automatically position the test-and-measurement probe 101 with respect to the DUT 102 may include a testing apparatus 111, where the DUT 102 is positioned next to a number of pins 112 that can be individually actuated to contact desired nodes or other points on the DUT 102. In such versions, the test-and-measurement probe 101 may be one or more of the pins 112 of the testing apparatus 111, and one or more of the pins 112 may be automatically positioned. The pins 112 may be automatically positioned by, for example, extending or retracting one or more of the pins 112 as needed to contact the desired portion of the DUT 102.

In still other versions, the means to automatically position the test-and-measurement probe 101 with respect to the DUT 102 may be a much smaller-scale device, for example, a device that employs microelectromechanical systems (MEMS). Such a MEMS-based device may mobilize itself, for example, by any combination of rolling, sliding, walking, crawling, telescoping, etc., to position an integrated test-and-measurement probe to a desired test point on the DUT. Such a MEMS-based device may be disposed on the DUT 102 itself.

Returning to FIG. 1, in example versions, the test-and-measurement probe 101 may include multiple probe tips and the robot 106 may be configured to change between the probe tips. Hence, for example, the robot 106 may be able to change between a probe tip that measures power, a probe tip that measures voltage, and a probe tip that measures current. In versions, the system 100 may include multiple robots 106, each robot 106 configured to automatically position a corresponding test-and-measurement probe 101. Each test-and-measurement probe 101 may be the same type of probe, or they may be different. For example, a first robot 106 may be configured to automatically position a first test-and-measurement probe 101 that provides a stimulus signal to be injected into a particular node of the DUT 102, while a second robot 106 may be configured to automatically position a second test-and-measurement probe 101 that measures another node of the DUT 102 in response to the stimulus signal.

In versions, the electronic signal acquired from the DUT 102, or a representation of the electronic signal, could be displayed for the user-operator. The electronic signal could be displayed, for example, on a screen on the robot 106 or on the user interface 104. As noted above, in versions the user interface 104 may be part of or may include augmented reality hardware or virtual reality hardware. Accordingly, the electronic signal could be displayed on the augmented reality hardware or virtual reality hardware. In versions, the electronic signal acquired from the DUT 102 could be represented by an Andon light, where, for example, the electronic signal is represented by one or more colored lights visible to a human operator.

The system 100 may include a controller 107. The controller 107 may, for example, provide instructions to the robot 106 to automatically position the test-and-measurement probe 101 with respect to the DUT 102 or provide instructions or data to, or receive instructions or data from, the user interface 104.

The controller 107 may include a processor, which may be implemented as any processing circuitry, such as, but not limited to, a microprocessor, an application specific integration circuit (ASIC), programmable logic circuits, etc. The controller 107 may further include computer storage media coupled to the processor. The computer storage media can may include a non-transitory storage medium that includes programs configured to be read by the processor and be executed upon reading. The processor may be configured to execute instructions from the computer storage media and may perform any methods or associated operations indicated by such instructions. The computer storage media may be implemented as processor cache, random access memory (RAM), read only memory (ROM), solid-state memory, hard disk drive(s), and/or any other memory type. The computer storage media acts as a medium for storing data, such as instructions for the robot 106, instructions for the user interface 104, data acquired as a result of the disclosed operations, computer program products, and other instructions and data. The controller 107 may comprise one or more controllers.

The controller 107 may be located separately from the robot 106 or the user interface 104, or both, and may communicate with the robot 106 or the user interface 104, or both, through a wired or wireless connection. Likewise, the controller 107 may be located separately from the computer storage media and may communicate with the computer storage media through a wired or wireless connection. The robot 106 may communicate with the user interface 104, particularly if the controller 107 is within the robot 106 or the user interface 104, through a wired or wireless connection. FIG. 1 illustrates wireless connections 108 between these components. As will be understood by one skilled in the art, the controller 107 may also be in electronic communication with a variety of other devices, such as, but not limited to, a communication device, the test-and-measurement instrument 110, another test-and-measurement device, a repository of DUT design data, a vision system 109 (discussed below), etc.

As illustrated in FIG. 1, the system 100 may also include a vision system 109 configured to scan the topology of the DUT 102. As further explained below, the vision system 109 may be used to correlate the selected virtual node of the digital representation 103 to the corresponding actual node of the DUT 102. The vision system 109 may communicate with the controller 107, the robot 106, or the user interface 104 through a wired or wireless connection. In versions, the vision system 109 may utilize conventional 2D visible light imaging. In other versions, in addition to, or as an alternative to, 2D visible light imaging, the vision system 109 may utilize any form of camera and imaging technique, such as 3D visible light imaging, multispectral imaging, hyperspectral imaging, infrared light imaging, line scan imaging, X-ray imaging, or other radiographic imaging, and the like, to name a few examples.

FIG. 2 illustrates an example method of indirectly acquiring a signal from a device under test 102, according to an example configuration. With reference to both FIG. 1 and FIG. 2, a method 200 of indirectly acquiring a signal from a DUT 102 may include electronically indicating 201 a selected node on a digital representation 103 of the physical electronic circuit; correlating 202 the selected node on the digital representation 103 to an actual node on the physical electronic circuit; automatically positioning 203, in response to electronically indicating the selected node, a test-and-measurement probe 101 to a position on the DUT 102 corresponding to the actual node; and acquiring 204, with the test-and-measurement probe 101, an electronic signal from the actual node.

In example configurations, electronically indicating 201 the selected node may be done via an input through a user interface 104. As an example, the user interface 104 and input device 105 may be a touchscreen with an associated stylus. In this example configuration, the user-operator may view an electronic schematic of a circuit on the touchscreen 104 and identify the node of interest in the DUT 102 by using the stylus 105 to touch, circle, or otherwise select the image of the corresponding node in the electronic schematic that appears on the touchscreen. The user-operator may also specify what electronic signal to acquire by, for example, specifying a particular test to perform or a particular measurement to obtain. For example, the user-operator may indicate, through the user interface, a particular differential amplifier on the digital representation 103 of the physical electronic circuit and also indicate, through the user interface, a desire to obtain a differential voltage measurement at the input of the particular differential amplifier.

In order for the test-and-measurement probe 101 to be automatically positioned, in response to the user-operator electronically indicating the selected node, the digital representation 103 of the physical electronic circuit may first need to be correlated to the physical electronic circuit itself.

In example configurations, correlating 202 the selected node to the actual node includes correlating a two degree of freedom grid that is keyed to the physical electronic circuit with a two degree of freedom grid that is keyed to the digital representation 103 of the physical electronic circuit. The two degree of freedom grid for the physical electronic circuit has an origin and orthogonal x- and y-axes relative to a primary plane of the physical electronic circuit. The primary plane, for example, may coincide with the substrate of the physical electronic circuit. Or, as another example, the primary plane may coincide with an outermost conductive layer, e.g. a top or bottom layer, of the physical electronic circuit. Hence, for example, correlating the two grids may include conceptually aligning the origins of the two grids as well as the x- and y-axes of each grid.

In configurations, rather than a fixed grid and shared common origin, the robot's positioning of the test-and-measurement probe 101 may be tied to the relative location of components on the DUT 102. Accordingly, as the design of the DUT 102 evolves, a remap or re-correlation would not be needed unless components had been added or removed from the DUT 102.

In example configurations, correlating 202 the selected node to the actual node may include using a vision system 109 to scan the topology of the physical electronic circuit to identify the actual node on the physical electronic circuit based on the selected node on the digital representation 103. The vision system 109 maybe useful, for example, if the physical electronic circuit is tilted or angled relative to the two degree of freedom grid. The vision system 109 may also be useful, for example, if the physical electronic circuit is flexible, curved, or is otherwise non-planar. The vision system 109 may, for example, map key topologies to enable referencing and probing without the need for rigid bounds.

In example configurations, correlating 202 the selected node to the actual node may include identifying a test point in a PCB design file for the physical electronic circuit, where the test point corresponds to the selected node and to the actual node. Hence, for example, the controller 107 may receive an indication of the selected node and then map the selected node to a corresponding test node in the PCB design file. In versions, the PCB other design file may reside in the cloud.

In example configurations, a robot 106 may automatically position the test-and-measurement probe 101 in response to electronically indicating the selected node. As noted above, the robot 106 could be, for example, a robotic arm, a two-axis positioning device, a three-axis positioning device, or other multi-degree-of-freedom machine.

In example configurations, the method may optionally include displaying 205 a representation of the electronic signal acquired from the actual node. This is explained above in the discussion of FIG. 1.

In example configurations, the method may optionally include storing 206 the electronic signal from the actual node, or a representation of that electronic signal, in a computer storage medium.

In example configurations, the method may optionally include comparing 207 the electronic signal from the actual node to a reference value. For example, the reference value may be an expected value for the electronic signal acquired from the actual node. The expected value may be, for example, a predetermined value, such as the anticipated voltage at the actual node based on the design of the physical electronic circuit and the operating parameters (such as the voltage applied to the physical electronic circuit and the status of the circuit elements in the physical electronic circuit). As another example, the expected value may be based on the electronic signal acquired from the actual node in previous iterations of the method (see below). Hence, the expected value may be, for example, an average or median value of the electronic signal acquired from the actual node in previous iterations of the method. As another example, the expected value may be based on mathematical calculations from a circuit simulation. In versions, the signal acquired from the actual node is an acquired waveform, the reference value may be a series of reference values such as a reference waveform, and the acquired waveform may be compared with the reference waveform.

In example configurations, the method may optionally include iterating 208 the operations described above.

EXAMPLES

Illustrative examples of the disclosed technologies are provided below. A particular configuration of the technologies may include one or more, and any combination of, the examples described below.

Example 1 includes a system for probing a device under test (DUT), the system comprising: a test-and-measurement probe; a user interface displaying a digital representation of the DUT, the digital representation including virtual nodes that correspond to actual nodes of a physical circuit on the DUT; a robot configured to position the test-and-measurement probe with respect to the DUT; and a controller configured to receive an indication of a user-selected virtual node from the user interface, and to provide instructions to the robot to position the test-and-measurement probe to an actual node on the DUT corresponding to the user-selected virtual node.

Example 2 includes the system of Example 1, the test-and-measurement probe further comprising multiple probe tips.

Example 3 includes the system of Example 2, the robot being further configured to change between the multiple probe tips.

Example 4 includes the system of any of Examples 1-3, further comprising a vision system configured to scan the topology of the DUT and to communicate with the controller.

Example 5 includes the system of any of Examples 1-4, in which the user interface comprises a touchscreen.

Example 6 includes the system of any of Examples 1-5, in which the test-and-measurement probe is configured to acquire a signal from the actual node.

Example 7 includes the system of any of Examples 1-6, further comprising a test-and-measurement instrument operatively coupled to the test-and-measurement probe.

Example 8 includes a method of indirectly acquiring a test-and-measurement signal from a device under test (DUT), the DUT including a physical electronic circuit, the method comprising: electronically indicating a selected node on a digital representation of the physical electronic circuit; correlating the selected node on the digital representation to an actual node on the physical electronic circuit; automatically positioning, in response to electronically indicating the selected node, a test-and-measurement probe to a position on the DUT corresponding to the actual node; and acquiring, with the test-and-measurement probe, an electronic signal from the actual node.

Example 9 includes the method of Example 8, in which electronically indicating the selected node comprises electronically indicating, via an input through a user interface, the selected node.

Example 10 includes the method of any of Examples 8-9, in which automatically positioning the test-and-measurement probe comprises automatically positioning, by a robot, the test-and-measurement probe.

Example 11 includes the method of any of Examples 8-10, further comprising displaying a representation of the electronic signal from the actual node.

Example 12 includes the method of any of Examples 8-11, in which correlating the selected node to the actual node comprises using a vision system to scan the topology of the physical electronic circuit to identify the actual node on the physical electronic circuit based on the selected node on the digital representation.

Example 13 includes the method of any of Examples 8-12, in which correlating the selected node to the actual node comprises correlating a two degree of freedom grid that is keyed to the physical electronic circuit with a two degree of freedom grid that is keyed to the digital representation of the physical electronic circuit.

Example 14 includes the method of any of Examples 8-13, in which correlating the selected node to the actual node comprises identifying a test point in a printed circuit board (PCB) design file for the physical electronic circuit, the test point corresponding to the selected node and to the actual node.

Example 15 includes the method of any of Examples 8-14, further comprising iteratively repeating: electronically indicating the selected node on the digital representation of the physical electronic circuit; correlating the selected node on the digital representation to the actual node on the physical electronic circuit; automatically positioning, in response to electronically indicating the selected node, the test-and-measurement probe to a position on the DUT corresponding to the actual node; acquiring, with the test-and-measurement probe, the electronic signal from the actual node; storing the electronic signal from the actual node in a computer storage medium; and comparing the electronic signal from the actual node to a reference value.

Example 16 includes the method of Example 15, in which comparing the electronic signal from the actual node to the reference value comprises comparing the electronic signal from the actual node to an expected value for the electronic signal from the actual node.

Example 17 includes a non-transitory computer-readable medium having computer-executable instructions stored thereon that, in response to execution by a computing device, cause the computing device to perform operations, the operations comprising: receiving an electronic indication of a selected node on a digital representation of a physical electronic circuit; correlating the selected node on the digital representation to an actual node on the physical electronic circuit; providing instructions to a robot to automatically position a test-and-measurement probe to a position on the physical electronic circuit corresponding to the actual node; and receiving, from the test-and-measurement probe, an electronic signal acquired from the actual node.

Example 18 includes the non-transitory computer-readable medium of Example 17, in which receiving the electronic indication of the selected node on the digital representation of the physical electronic circuit comprises receiving, from a user interface, the electronic indication of the selected node on the digital representation of the physical electronic circuit.

Example 19 includes the non-transitory computer-readable medium of any of Examples 17-18, the operations further comprising iteratively repeating: receiving an electronic indication of a selected node on a digital representation of a physical electronic circuit; correlating the selected node on the digital representation to an actual node on the physical electronic circuit; providing instructions to a robot to automatically position a test-and-measurement probe to a position on the physical electronic circuit corresponding to the actual node; receiving, from the test-and-measurement probe, an electronic signal acquired from the actual node; storing the electronic signal from the actual node; and comparing the electronic signal from the actual node to a reference value.

Example 20 includes the non-transitory computer-readable medium of Example 19, in which comparing the electronic signal from the actual node to the reference value comprises comparing the electronic signal from the actual node to an expected value for the electronic signal from the actual node.

Aspects may operate on a particularly created hardware, on firmware, digital signal processors, or on a specially programmed general-purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various configurations. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular example configuration, that feature can also be used, to the extent possible, in the context of other example configurations.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific example configurations have been described for purposes of illustration, it will be understood that various modifications may be made without departing from the spirit and scope of the disclosure.

What is claimed is:

1. A system for probing a device under test (DUT), the system comprising:
   a test-and-measurement probe;
   a user interface displaying a digital representation of the DUT, the digital representation including virtual nodes that correspond to actual nodes of a physical circuit on the DUT;
   a robot configured to position the test-and-measurement probe with respect to the DUT;
   a controller configured to receive an indication of a user-selected virtual nodefrom the user interface, and to provide instructions to the robot to position the test-and-measurement probe to an actual node on the DUT corresponding to the user-selected virtual node; and
   a vision system configured to scan the topology of the physical circuit on the DUT and to communicate with the controller to correlate the user-selected virtual node to the actual node on the DUT and to map key topologies of the physical circuit on the DUT to enable referencing and probing without the need for rigid bounds,
   wherein the vision system uses one or more of 3D visible light imaging, multispectral imaging, hyperspectral imaging, infrared light imaging, line scan imaging, X-ray imaging, and other radiographic imaging.

2. The system of claim 1, the test-and-measurement probe further comprising multiple probe tips.

3. The system of claim 2, in which the robot is further configured to change between the multiple probe tips.

4. The system of claim 1, in which the user interface comprises a touchscreen.

5. The system of claim 1, in which the test-and-measurement probe is configured to acquire a signal from the actual node.

6. The system of claim 1, further comprising a test-and-measurement instrument operatively coupled to the test-and-measurement probe.

7. A method of indirectly acquiring a signal from a device under test (DUT), the DUT including a physical circuit, the method comprising:
   receiving an electronic indication of a selected node on a digital representation of the physical circuit;
   correlating the selected node on the digital representation to an actual node on the physical circuit;
   automatically positioning, in response to receiving the electronic indication of the selected node, a test-and-measurement probe to a position on the DUT corresponding to the actual node; and
   acquiring, with the test-and-measurement probe, a signal from the actual node,
   in which correlating the selected node to the actual node comprises using a vision system to scan the topology of the physical electronic circuit to identify the actual node on the physical circuit based on the selected node on the digital representation and mapping key topologies of the physical electronic circuit to enable referencing and probing without the need for rigid bounds,
   wherein the vision system uses one or more of 3D visible light imaging, multispectral imaging, hyperspectral imaging, infrared light imaging, line scan imaging, X-ray imaging, and other radiographic imaging.

8. The method of claim 7, in which receiving an electronic indication of the selected node comprises receiving an electronic indication, via an input through a user interface, of the selected node.

9. The method of claim 7, in which automatically positioning the test-and-measurement probe comprises automatically positioning, by a robot, the test-and-measurement probe.

10. The method of claim 7, further comprising displaying a representation of the signal from the actual node.

11. The method of claim 7 in which correlating the selected node to the actual node comprises correlating a two degree of freedom grid that is keyed to the physical circuit with a two degree of freedom grid that is keyed to the digital representation of the physical circuit.

12. The method of claim 7, in which correlating the selected node to the actual node comprises identifying a test point in a printed circuit board (PCB) design file for the physical circuit, the test point corresponding to the selected node and to the actual node.

13. The method of claim 7, further comprising iteratively repeating:
   receiving an electronic indication of the selected node on the digital representation of the physical circuit;
   correlating the selected node on the digital representation to the actual node on the physical circuit;
   automatically positioning, in response to receiving the electronic indication of the selected node, the test-and-measurement probe to a position on the DUT corresponding to the actual node;
   acquiring, with the test-and-measurement probe, the signal from the actual node;
   storing the signal from the actual node in a computer storage medium; and
   comparing the signal from the actual node to a reference value.

14. The method of claim 13, in which comparing the signal from the actual node to the reference value comprises comparing the signal from the actual node to an expected value for the signal from the actual node.

15. A non-transitory computer-readable medium having computer-executable instructions stored thereon that, in response to execution by a computing device, cause the computing device to perform operations, the operations comprising:
   receiving an electronic indication of a selected node on a digital representation of a physical circuit;
   correlating the selected node on the digital representation to an actual node on the physical circuit;
   providing instructions to a robot to automatically position a test-and-measurement probe to a position on the physical circuit corresponding to the actual node; and
   receiving, from the test-and-measurement probe, a signal acquired from the actual node,
   in which correlating the selected node to the actual node comprises using a vision system to scan the topology of the physical electronic circuit to identify the actual node on the physical circuit based on the selected node on the digital representation and to map key topologies of the physical electronic circuit to enable referencing and probing without the need for rigid bounds,
   wherein the vision system uses one or more of 3D visible light imaging, multispectral imaging, hyperspectral imaging, infrared light imaging, line scan imaging, X-ray imaging, and other radiographic imaging.

16. The non-transitory computer-readable medium of claim 15, in which receiving the electronic indication of the selected node on the digital representation of the physical circuit comprises receiving, from a user interface, the electronic indication of the selected node on the digital representation of the physical circuit.

17. The non-transitory computer-readable medium of claim 15, the operations further comprising iteratively repeating:
- receiving an electronic indication of a selected node on a digital representation of a physical circuit;
- correlating the selected node on the digital representation to an actual node on the physical circuit;
- providing instructions to a robot to automatically position a test-and-measurement probe to a position on the physical circuit corresponding to the actual node;
- receiving, from the test-and-measurement probe, a signal acquired from the actual node;
- storing the signal from the actual node; and
- comparing the signal from the actual node to a reference value.

18. The non-transitory computer-readable medium of claim 17, in which comparing the signal from the actual node to the reference value comprises comparing the signal from the actual node to an expected value for the signal from the actual node.

* * * * *